US010153339B2

United States Patent
Voss et al.

(10) Patent No.: US 10,153,339 B2
(45) Date of Patent: Dec. 11, 2018

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Stephan Voss, Munich (DE); Alexander Breymesser, Villach (AT); Hans-Joachim Schulze, Taufkirchen (DE); Yvonne Gawlina-Schmidl, Pullach im Isartal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/708,209

(22) Filed: Sep. 19, 2017

(65) Prior Publication Data

US 2018/0090565 A1  Mar. 29, 2018

(30) Foreign Application Priority Data

Sep. 23, 2016 (DE) .......................... 10 2016 118 012

(51) Int. Cl.
*H01L 29/06* (2006.01)
*H01L 21/225* (2006.01)
(Continued)

(52) U.S. Cl.
CPC ........ *H01L 29/0638* (2013.01); *H01L 21/225* (2013.01); *H01L 21/265* (2013.01);
(Continued)

(58) Field of Classification Search
CPC ............. H01L 29/0638; H01L 29/0619; H01L 29/1095; H01L 29/7395; H01L 29/7802; H01L 21/225; H01L 21/265
See application file for complete search history.

(56) References Cited

U.S. PATENT DOCUMENTS

| 5,751,024 A | 5/1998 | Takahashi |
| 5,894,139 A * | 4/1999 | Otsuki ................ H01L 29/0696 257/139 |

(Continued)

FOREIGN PATENT DOCUMENTS

| DE | 2558982 A1 | 7/1976 |
| DE | 102005004355 B4 | 12/2008 |

(Continued)

OTHER PUBLICATIONS

Bothe, Karsten et al., "Electronically Activated Boron-Oxygen-Related Recombination Centers in Crystalline Silicon", Journal of Applied Physics 99, 013701, Jan. 3, 2006, pp. 1-12.

*Primary Examiner* — Nathan W Ha
(74) *Attorney, Agent, or Firm* — Murphy, Bilak & Homiller, PLLC

(57) ABSTRACT

A semiconductor device includes a common doping region located within a semiconductor substrate of the semiconductor device. The common doping region includes a first portion. A maximal doping concentration within the first portion is higher than $1 \cdot 10^{15}$ cm$^{-3}$. The common doping region includes a second portion. A minimal doping concentration within the second portion is lower than 50% of the maximal doping concentration within the first portion of the common doping region. The common doping region includes a third portion. A minimal doping concentration within the third portion is more than 30% higher than the minimal doping concentration within the second portion. The second portion of the common doping region is located vertically between the first portion of the common doping region and the third portion of the common doping region.

18 Claims, 2 Drawing Sheets

(51) Int. Cl.
  *H01L 21/265* (2006.01)
  *H01L 21/324* (2006.01)
  *H01L 29/10* (2006.01)
  *H01L 29/739* (2006.01)
  *H01L 29/78* (2006.01)

(52) U.S. Cl.
  CPC ........ *H01L 21/324* (2013.01); *H01L 29/0619* (2013.01); *H01L 29/1095* (2013.01); *H01L 29/7395* (2013.01); *H01L 29/7802* (2013.01)

(56) References Cited

U.S. PATENT DOCUMENTS

| | | |
|---|---|---|
| 7,579,649 B2 | 8/2009 | Peake et al. |
| 7,800,168 B2 | 9/2010 | Ogura et al. |
| 8,361,893 B2 | 1/2013 | Schmidt et al. |
| 9,012,980 B1 | 4/2015 | Schulze et al. |
| 9,324,783 B2 | 4/2016 | Falck et al. |
| 2009/0184338 A1* | 7/2009 | Hisamoto ........... H01L 29/0619 257/139 |
| 2013/0187240 A1 | 7/2013 | Takano et al. |
| 2014/0084433 A1 | 3/2014 | Otremba et al. |
| 2014/0088433 A1 | 3/2014 | Shan et al. |
| 2014/0332842 A1* | 11/2014 | Veeramma ............. H01L 23/62 257/119 |
| 2015/0200247 A1 | 7/2015 | Bauer et al. |
| 2015/0214347 A1 | 7/2015 | Falck et al. |
| 2016/0013265 A1* | 1/2016 | Yilmaz ............... H01L 29/0619 257/192 |
| 2016/0049465 A1* | 2/2016 | Konstantinov ..... H01L 29/6606 257/77 |
| 2016/0093690 A1 | 3/2016 | Falck et al. |
| 2016/0276446 A1* | 9/2016 | Wakimoto ............ H01L 29/861 |
| 2017/0047319 A1* | 2/2017 | Naito ................. H01L 21/8234 |
| 2017/0148870 A1* | 5/2017 | Huang ................ H01L 29/0619 |
| 2017/0317163 A1* | 11/2017 | Yoshimura ........... H01L 29/063 |

FOREIGN PATENT DOCUMENTS

| | | |
|---|---|---|
| DE | 102016102861 B3 | 5/2017 |
| EP | 0361319 A2 | 4/1990 |

\* cited by examiner

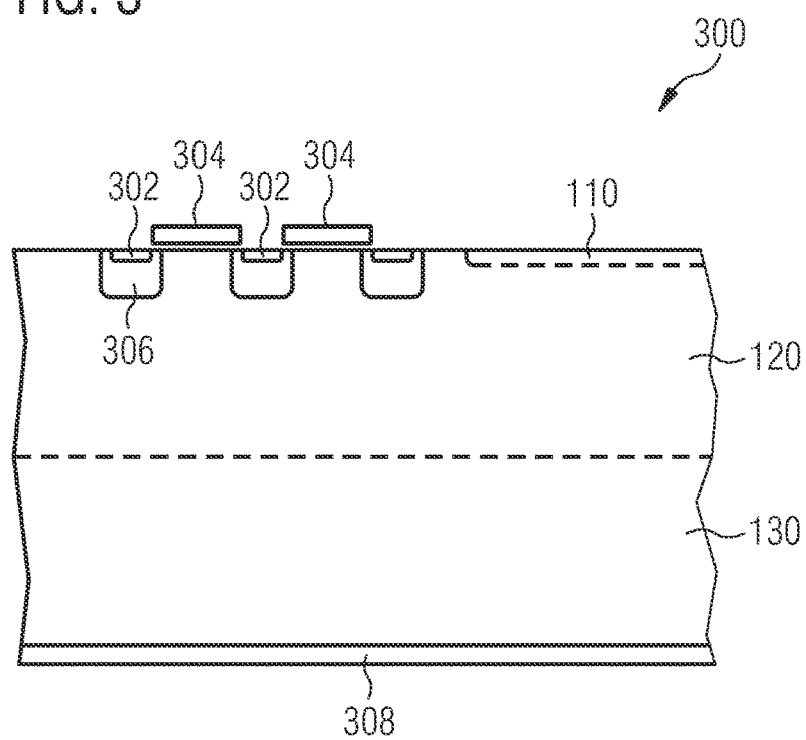
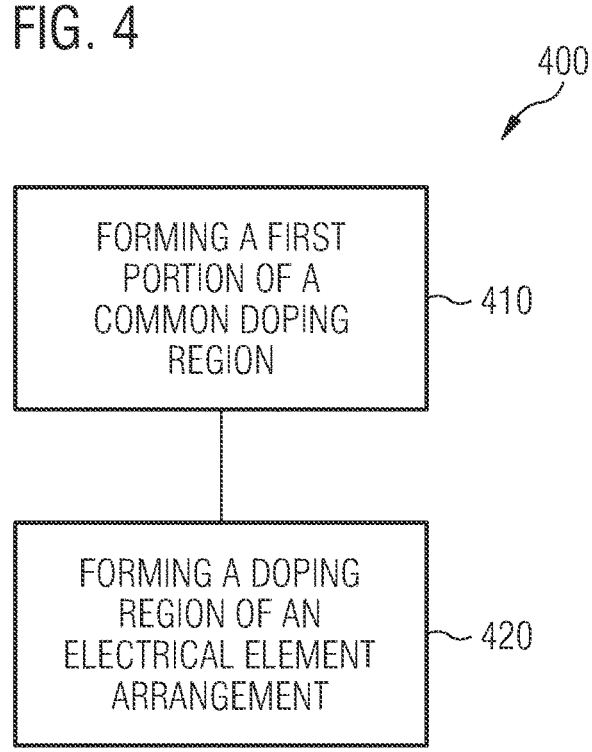

SEMICONDUCTOR DEVICE AND METHOD FOR FORMING A SEMICONDUCTOR DEVICE

TECHNICAL FIELD

Embodiments relate to concepts for power semiconductor devices, and in particular to semiconductor devices and methods for forming semiconductor devices.

BACKGROUND

A high breakdown voltage and low leakage current are desired for many semiconductor devices. For example, power semiconductor devices are often designed to block several hundred volts while the leakage currents should remain low.

SUMMARY

There may be a demand to provide an improved concept for semiconductor devices, which enables reducing leakage currents and/or increasing a breakdown voltage of semiconductor devices.

Some embodiments relate to a semiconductor device comprising a common doping region located within a semiconductor substrate of the semiconductor device. The common doping region comprises a first portion. A maximal doping concentration within the first portion is higher than $1 \cdot 10^{15}$ cm$^{-3}$. The common doping region comprises a second portion. A minimal doping concentration within the second portion is lower than 50% of the maximal doping concentration within the first portion of the common doping region. The common doping region comprises a third portion. A minimal doping concentration within the third portion is more than 30% higher than the minimal doping concentration within the second portion. At least a part of the second portion of the common doping region is located vertically between the first portion of the common doping region and the third portion of the common doping region.

Some embodiments relate to a method for forming a semiconductor device. The method comprises forming a first portion of a common doping region located within a semiconductor substrate of the semiconductor device. A maximal doping concentration within the first portion is higher than $1 \cdot 10^{15}$ cm$^{-3}$. The common doping region comprises a second portion. A minimal doping concentration within the second portion is lower than 50% of the maximal doping concentration within the first portion of the common doping region. The common doping region comprises a third portion. A minimal doping concentration within the third portion is more than 30% higher than the minimal doping concentration within the second portion. At least a part of the second portion of the common doping region is located vertically between the first portion of the common doping region and the third portion of the common doping region.

BRIEF DESCRIPTION OF THE FIGURES

Some embodiments of apparatuses and/or methods will be described in the following by way of example only, and with reference to the accompanying figures, in which:

FIG. 3 shows a schematic cross section of a semiconductor device comprising a vertical transistor arrangement; and FIG. 4 shows a flow chart of a method for forming a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
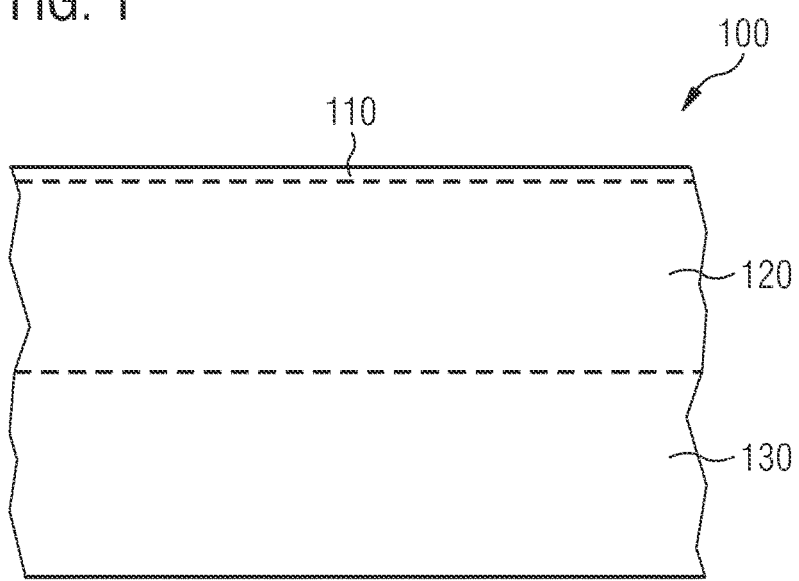
FIG. 1 shows a schematic cross section of a semiconductor device.

FIG. 1 shows a schematic cross section of a semiconductor device 100 comprising a common doping region located within a semiconductor substrate of the semiconductor device. The common doping region comprises a first portion 110. A maximal doping concentration within the first portion 110 is higher than $1 \cdot 10^{15}$ cm$^{-3}$. The common doping region comprises a second portion 120. A minimal doping concentration within the second portion 120 is lower than 50% (or lower than 40%, lower than 30%, lower than 20%, lower than 10%, lower than 1%, lower than 0.1%) of the maximal doping concentration within the first portion of the common doping region. The common doping region comprises a third portion 130. A minimal doping concentration within the third portion 130 is more than 30% (or more than 50%, more than 100%) higher than the minimal doping concentration within the second portion 120. At least a part of the second portion 120 of the common doping region is located vertically between the first portion 110 of the common doping region and the third portion 130 of the common doping region.

The first portion having an increased doping concentration may avoid or reduce a vertical and/or lateral expansion of a space charge region towards an edge of the semiconductor device or a surface of the semiconductor device (e.g. at least in blocking state of the semiconductor device). In this way, the breakdown voltage of the semiconductor device may be increased and/or a leakage current may be reduced.

For example, the common doping region is a portion of the semiconductor substrate having a single (first) conductivity type (e.g. n-doped or p-doped). Consequently, the first portion, the second portion and the third portion of the common doping region comprise the same conductivity type.

For example, the first portion 110 of the common doping region may be located at a front side surface of the semiconductor substrate. For example, the first portion 110 of the common doping region may vertically extend from a front side surface of the semiconductor substrate to a distance of less than 20 μm (or less than 15 μm, less than 10 μm, less than 5 μm) from the front-side surface of the semiconductor substrate. Alternatively, the first portion 110 may be located close to the front side surface of the semiconductor substrate, but with a vertical distance to the front side surface of the semiconductor substrate. For example, a vertical distance between the front-side surface of the semiconductor substrate and the first portion 110 may be larger than 100 nm (or larger than 500 nm, larger than 1 μm, larger than 5 μm).

For example, the maximal doping concentration within the first portion 110 is higher than $1 \cdot 10^{15}$ cm$^{-3}$ (or higher than $2 \cdot 10^{15}$ cm$^{-3}$, higher than $5 \cdot 10^{15}$ cm$^{-3}$, higher than $1 \cdot 10^{16}$ cm$^{-3}$). For example, the maximal doping concentration within the first portion 110 may be lower than $1 \cdot 10^{17}$ cm$^{-3}$ (or lower than $5 \cdot 10^{16}$ cm$^{-3}$, lower than $1 \cdot 10^{16}$ cm$^{-3}$).

For example, the first portion 110 of the common doping region may comprise a (average) thickness of more than 400 nm (or more than 500 nm, more than 800 nm, more than 1 μm, more than 2 μm, more than 3 μm). The first portion 110 of the common doping region may comprise a (average) thickness of less than 5 μm (or less than 4 μm, less than 3 μm, less than 2 μm, less than 1 μm).

For example, the first portion 110 may laterally surround an active area of the semiconductor device. The first portion 110 laterally surrounding the active area may deter an expansion of the space charge region towards the edge of the semiconductor substrate. For example, the first portion of the common doping region may be at least partially located in an edge termination region of the semiconductor substrate. For example, the first portion 110 may laterally extend over more than 50% (or more than 60%, more than 70%, more than 80%, more than 90%) of an edge termination region of the semiconductor substrate. For example, the first portion 110 may laterally extend over the entire edge termination region.

For example, the first portion of the common doping region may be solely located in the edge termination region of the semiconductor device. Alternatively, a part of the first portion may be located in the edge termination region of the semiconductor device, and a part of the first portion may be located in an active region/cell region of the semiconductor device, e.g. at an outer edge of the active region/cell region. For example, the first portion may be formed by an implantation of dopants over the whole semiconductor substrate (e.g. blanket implantation) or by a masked implantation. For example, a doping concentration caused by forming the first portion may be below doping concentrations of doping regions (e.g. body doping region and source doping region) of electrical element structures within the cell region of the semiconductor substrate. For example, the first portion may be formed by implanting at least one of phosphorus ions (chem. symbol P), arsenic ions (As) and antimony ions (Sb).

For example, a lateral distance between the first portion 110 and an edge of the semiconductor substrate may be larger than 1 μm (or larger than 2 μm, larger than 5 μm, larger than 10 μm). Alternatively, the first portion 110 may extend from an edge of the semiconductor substrate inwardly. For example, a lateral distance between the first portion 110 and an active region/cell region of the semiconductor device may be larger than 1 μm (or larger than 2 μm, larger than 5 μm, larger than 10 μm).

For example, the first portion 110 of the common doping region may comprise a lateral (minimal) width of at least 5 μm (at least 8 μm, at least 10 μm, at least 15 μm, at least 20 μm, at least 50 μm, at least 100 μm). A lateral width of at least 5 μm may sufficiently suppress the expansion of the space charge region.

For example, the minimal doping concentration within the second portion 120 may be lower than $3 \cdot 10^{14}$ cm$^{-3}$ (or lower than $2 \cdot 10^{14}$ cm$^{-3}$, lower than $1 \cdot 10^{14}$ cm$^{-3}$, lower than $5 \cdot 10^{13}$ cm$^{-3}$, lower than $1 \cdot 10^{13}$ cm$^{-3}$, lower than $8 \cdot 10^{12}$ cm$^{-3}$, lower than $5 \cdot 10^{12}$ cm$^{-3}$, lower than $3 \cdot 10^{12}$ cm$^{-3}$). For example, the minimal doping concentration within the second portion 120 may be higher than $1 \cdot 10^{12}$ cm$^{-3}$ (or higher than $2 \cdot 10^{12}$ cm$^{-3}$, higher than $5 \cdot 10^{12}$ cm$^{-3}$, higher than $1 \cdot 10^{13}$ cm$^{-3}$, higher than $5 \cdot 10^{13}$ cm$^{-3}$, higher than $1 \cdot 10^{14}$ cm$^{-3}$).

For example, a doping concentration within the second portion 120 may increase vertically towards a back side of the semiconductor substrate. For example, a doping concentration within the second portion 120 may increase vertically from a sub-portion of the second portion located vertically closer to the front side of the semiconductor substrate to a sub-portion of the second portion 120 located vertically closer to a backside surface of the semiconductor substrate. For example, the doping concentration within the second portion may increase by 30% between the minimal doping concentration within the second portion 120 and a border between the second portion 120 and the third portion 130. For example, the doping concentration within the second portion may increase by more than (or at least) 30% (e.g. 30%, 40%) or more than (or at least) 50% (e.g. 50%, 60%, 80%), or more than (or at least) 100% (e.g. 100%, 200%), or more than (or at least) a factor 3 (e.g. a factor 3, a factor 5, a factor 8), or more than (or at least) a factor 10 (e.g. a factor 10, a factor 20, a factor 50) between the minimal doping concentration within the second portion 120 and a border between the second portion 120 and the third portion 130.

The decreasing doping concentration within the second portion 120 may be caused by diffusion of hydrogen and/or vacancies towards the surface of the semiconductor substrate. The hydrogen may diffuse out of the semiconductor substrate or may accumulate at the surface of the semiconductor substrate. Vacancies reaching the surface of the semiconductor substrate may recombine more efficiently than within the semiconductor substrate. Therefore, less hydrogen related donors may be generated close to the surface resulting in the decreasing doping concentration within the second portion 120.

For example, the third portion 130 of the common doping region may vertically extend from a distance of more than 10 µm (or more than 20 µm, more than 25 µm, more than 30 µm, more than 40 µm, more than 50 µm, more than 80 µm) from a front-side surface of the semiconductor substrate towards a back-side surface of the semiconductor substrate. For example, the second portion 120 may vertically extend from the first portion to a distance of more than 25 µm (or more than 30 µm, more than 40 µm, more than 50 µm, more than 80 µm) from a front-side surface of the semiconductor substrate. For example, the second portion 120 may vertically extend from the first portion to the third portion. For example, the second portion 120 of the common doping region may be located vertically adjacent to the first portion 110 and vertically adjacent to the third portion 130. For example, a doping concentration within a portion of the common doping region vertically extending from a distance of more than 10 µm (or more than 20 µm, more than 25 µm, more than 40 µm, more than 50 µm, more than 80 µm) over more than 20 µm (or more than 50 µm or more than 100 µm) towards a backside surface of the semiconductor substrate may vary over the portion by less than 50% (or less than 30%, less than 20%, less than 15%, less than 10%) of an average doping concentration within said portion of the common doping region.

For example, an average doping concentration within the third portion 130 of the common doping region may be larger than $4·10^{12}$ cm$^{-3}$ (or larger than $1·10^{13}$ cm$^{-3}$, larger than $5·10^{13}$ cm$^{-3}$, larger than $1·10^{14}$ cm$^{-3}$). For example, an average doping concentration within the third portion 130 of the common doping region may be lower than $1·10^{15}$ cm$^{-3}$ (or lower than larger than $5·10^{14}$ cm$^{-3}$, lower than $1·10^{14}$ cm$^{-3}$, lower than $5·10^{13}$ cm$^{-3}$, lower than $1·10^{13}$ cm$^{-3}$).

For example, the doping within the second portion 120 and the third portion 130 may be mainly caused by a hydrogen (proton) implantation. The hydrogen implantation may cause hydrogen related donors (e.g. after an additional heat treatment). For example, more than 15% (or more than 20%, more than 25%, more than 50%, more than 70%, more than 90%) of the donors located within the second portion 120 and the third portion 130 of the common doping region of the semiconductor device 100 may be hydrogen related donors. Alternatively, the dopants within the second portion 120 and the third portion 130 may be mainly incorporated during an epitaxial growth of the semiconductor material of the second portion 120 and the third portion 130.

For example, at a part of the semiconductor substrate (e.g. within at least a part of an edge termination region), the common doping region may vertically extend from a front-side surface of the semiconductor substrate to a backside surface of the semiconductor substrate or to a region of different conductivity type (e.g. p-doping region) located vertically adjacent to the backside surface of the semiconductor substrate. For example, at a part of the semiconductor substrate, the common doping region may vertically extend from the front-side surface of the semiconductor substrate to the backside surface of the semiconductor substrate for a Field Effect Transistor arrangement or to an collector (or emitter) region of an IGBT arrangement. At least a part of the second portion 120 and the third portion 130 may form a drift region of a vertical transistor arrangement or a vertical diode arrangement. Optionally, the common doping region may comprise additionally a field stop region (e.g. comprising an average doping concentration larger than twice (or larger than five times) an average doping concentration of the third portion) located vertically between the back side surface of the semiconductor substrate and the third portion 130. A drain doping region of a vertical field effect transistor arrangement or a collector doping region of an insulated gate bipolar transistor arrangement may be located at a backside surface of the semiconductor substrate and adjacent to the drift region or the optional field stop region, for example. If the semiconductor device comprises a reverse-conducting insulated gate bipolar transistor arrangement, the collector doping region may comprise n and p doping region portions (for reverse conduction), for example.

The common doping region may comprise a first conductivity type (e.g. n or p) and a body region of a transistor structure of the semiconductor device may comprise a second conductivity type (e.g. p or n). In other words, the common doping region may comprise the first conductivity type which can be a p-doping (e.g. caused by incorporating aluminum ions or boron ions) or an n-doping (e.g. caused by incorporating phosphorous ions or arsenic ions). Consequently, the second conductivity type indicates an opposite n-doping or p-doping. In other words, the first conductivity type may indicate an n-doping and the second conductivity type may indicate a p-doping or vice-versa.

The semiconductor substrate of the semiconductor device 100 may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die. For example, the semiconductor substrate may comprise a thickness of more than 50 µm (or more than 80 µm, more than 100 µm, more than 120 µm, more than 150 µm, more than 200 µm). For example, if the semiconductor substrate is a silicon carbide-based semiconductor substrate, the semiconductor substrate may comprise a thickness larger than 3 µm (or larger than 5 µm, larger than 10 µm, larger than 20 µm, larger than 25 µm) and/or smaller than 40 µm (smaller than 35 µm, smaller than 30 µm).

The semiconductor substrate may comprise an active region/cell region laterally surrounded by an edge termination region. The cell region/active region may be a region of the semiconductor substrate used to conduct more than 90% of a current through the semiconductor substrate in an on-state or conducting state of the semiconductor device 100. For example, a plurality of transistor cells of a vertical transistor arrangement is located in the active region to conduct a current between front side and back side of the semiconductor substrate. The edge termination region may be located between an edge of the semiconductor substrate and the cell region/active region in order to support or block or reduce or dissipate a maximal voltage applied between the front side surface of the semiconductor substrate and a back side surface of the semiconductor substrate within the cell region laterally towards the edge of the semiconductor substrate.

For example, the edge termination region of the semiconductor device may comprise a channel stopper region laterally located between the first portion 110 of the common region and an edge of the semiconductor device. The channel stopper region may limit the formation of parasitic channels. For example, the channel stopper region may comprise a lateral width of more than 1 µm (or more than 2 µm, more than 5 µm, more than 10 µm). For example, a (average, vertical) thickness of the channel stopper region may differ by less than 20% (or less than 10%, less than 5%) from a (average) thickness of the first portion. For example, the channel stopper region may comprise a conductivity type being different from a conductivity type of the common channel region. For example, the channel stopper region may be located adjacent to an edge of the semiconductor substrate. For example, the channel stopper region may be located at the front-side surface of the semiconductor substrate. For example, a minimal vertical distance or maximal vertical distance of the channel stopper region from the front-side surface of the semiconductor substrate may differ by less than 20% (or less than 10%, less than 5%) from a minimal vertical distance or maximal vertical distance of the first portion 110 from the front-side surface of the semiconductor substrate.

For example, the semiconductor device may comprise a (vertical) electrical element arrangement. For example, the vertical electrical element arrangement of the semiconductor device and/or the whole semiconductor device may comprise a breakdown voltage of more than 10V, e.g. more than 20V, more than 50V, for example. The semiconductor device 100 may be a power semiconductor device. A power semiconductor device and/or the vertical electrical element arrangement (e.g. transistor arrangement or diode arrangement) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

For example, the vertical electrical element arrangement may be an electrical structure enabling a vertical current flow through the semiconductor substrate in a conductive state or on-state of the vertical electrical element arrangement. The vertical electrical element arrangement may be a vertical diode arrangement or a vertical transistor arrangement (e.g. a metal-oxide-semiconductor field effect transistor or insulated-gate-bipolar transistor).

For example, the vertical transistor arrangement may comprise or be a Metal Oxide Semiconductor Field Effect Transistor (MOSFET) arrangement or an Insulated-Gate Bipolar Transistor (IGBT) arrangement. The vertical transistor arrangement may comprise a plurality of (substantially equal) transistor cell structures.

For example, the edge of the semiconductor substrate may be a substantially vertical edge surface of the semiconductor substrate between a front-side surface of the semiconductor substrate and a backside surface of the semiconductor substrate.

For example, the vertical direction and a vertical dimension or thicknesses of layers may be measured orthogonal to a front side surface of the semiconductor substrate and a lateral direction and lateral dimensions may be measured in parallel to the front side surface of the semiconductor substrate.

Figure 2:
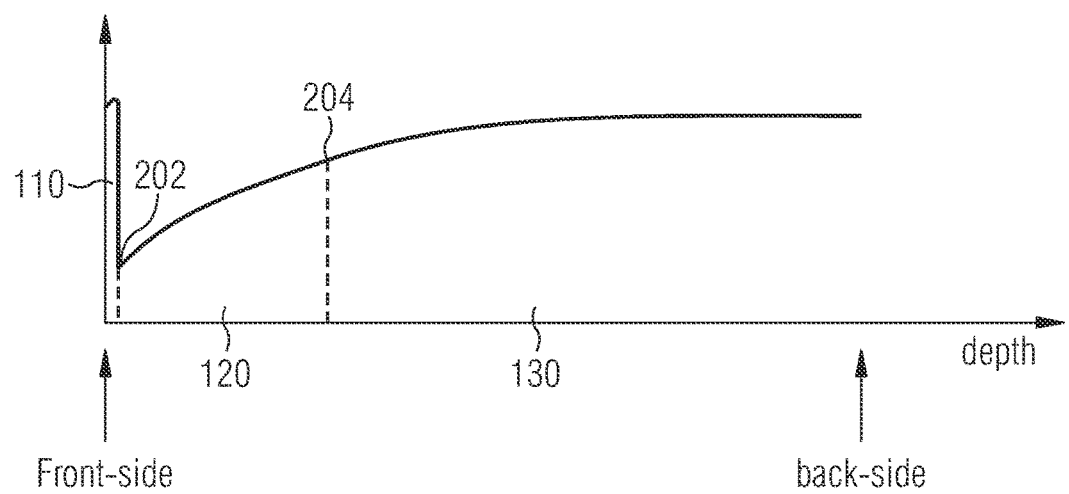
FIG. 2 shows a schematic diagram of a doping concentration within a common doping region of a semiconductor device.

FIG. 2 shows a schematic diagram of a doping concentration within a common doping region of a semiconductor device. The semiconductor device may be implemented similar to the semiconductor device described in connection with FIG. 1. The x-axis denotes a depth (distance from a front-side surface of a semiconductor substrate of the semiconductor device) and the y-axis denotes the doping concentration (e.g. dopants per $cm^3$). The common doping region comprises a first portion 110, a second portion 120 and a third portion.

For example, the first portion 110 may vertically extend from a front-side surface of the semiconductor substrate (or from a distance from the front-side surface of the semiconductor substrate) to a local minimum of the doping concentration 202 within the common doping region. The position of the local minimum of the doping concentration 202 may be a position of a minimal doping concentration between the first portion and the second portion. The second portion 120 may vertically extend from the local minimal doping concentration 202 to the third portion 130. A doping concentration at a transition 204 (continuous transition) from the second portion 120 to the third portion 130 may be 30% higher (or more than 30%, e.g. 40% higher, or 50% higher, or 80% higher, or 100% higher) than the local minimum doping concentration. The third portion 130 may vertically extend from the border 204 between the second portion 120 and the third portion 130 towards a backside surface of the semiconductor substrate.

The high doping concentration of the first portion 110 of the common doping region may avoid or reduce a vertical and lateral expansion of a space charge region towards an edge of the semiconductor device (e.g. near the front-side surface of the semiconductor substrate).

For example, the third portion 130 may vertically extend from the border 204 between the second portion 120 and the third portion 130 to the back-side surface of the semiconductor substrate or to a region within the semiconductor substrate having a conductivity type (e.g. based on p-doping) being different from a conductivity type (e.g. based on n-doping) of the common doping region.

For example, there may be a monotonous increase of the doping concentration with increasing depth. Alternatively, the third portion 130 may exhibit a doping maximum which is located in a certain (e.g. predefined) distance from the borders of the third portion 130.

FIG. 2 may show a cross section of a doping profile, e.g. of an IGBT (e.g. without showing the backside collector doping region, without the front-side body doping (region), or without showing an optional field-stop zone/region).

More details and aspects of the semiconductor device are mentioned in connection with the proposed concept or one or more examples described above or below. The semiconductor device may comprise one or more additional optional features corresponding to one or more aspects of the proposed concept or one or more examples described above (e.g. FIG. 1) or below (e.g. FIGS. 3-4).

FIG. 3 shows a schematic cross section of a semiconductor device 300 comprising a vertical transistor arrangement. The semiconductor device 300 may be implemented similar to one of the semiconductor device described in connection with FIGS. 1-2. The semiconductor device 300 comprises a common doping region comprising a first portion 110, a second portion 120 and a third portion 130. A part of the second portion 120 and the third portion 130 form a drift region of a vertical transistor arrangement. The semiconductor device further comprises one or more source regions 302 of the vertical transistor arrangement, one or more gate structures 304 of the vertical transistor arrangement, one or more body regions 306 of the vertical transistor arrangement, and a drain region 308 of the vertical transistor arrangement. The drain region 308 is part of the common doping region and is located vertically between the third portion 130 and a backside of the semiconductor substrate of the semiconductor device 300. The gates of the vertical transistor arrangement may be located at the front side surface of the semiconductor substrate as shown in FIG. 3 or within trenches extending into the semiconductor substrate. The vertical transistor arrangement may correspond to a vertical MOSFET transistor arrangement, for example.

For example, the body regions may extend at least 10% (or at least 20%, at least 25%, at least 30%, at least 40%, at least 50%, at least 100%, at least 200%) further into the semiconductor substrate than the first portion 110 of the common doping region (from a front-side surface of the semiconductor substrate). For example, a maximal depth of the body region may be more than 10% (or more than 20%, more than 30%, more than 50%, more than 100%) larger than maximal depth of the first portion 110.

A (maximal or average) doping concentration within the body regions 306 may be at least 20% higher (or at least 30% higher, at least 50% higher, at least 75% higher, at least 100% higher, at least 200% higher) than a (maximal or average) doping concentration within the first portion 110. For example, the common doping region and the body region comprise different conductivity types. For example, the body regions 306 may be electrically short-circuited with the source regions 302.

The first portion may be manufacturable by an unmasked implant over the whole semiconductor substrate, if the body regions comprise a higher doping concentration and extend further into the semiconductor substrate than the first portion.

For example, the common doping region may comprise a drift region of an electrical element arrangement of the semiconductor device. For example, the common doping region may be an n-doped region. For example, the drift region within a cell region of the semiconductor substrate may comprise substantially the same doping concentration profile at a given distance from the front-side surface of the semiconductor substrate as the second portion 120 and the third portion 130 at the edge termination region. For example, a vertical doping profile of the third portion may differ from a vertical doping profile within a vertical part of the drift region located at the same depth range (vertical position) within a cell region of the semiconductor substrate as the third portion of the common doping region by less than 20% (or less than 15%, less than 10%, less than 5%) of a maximal doping concentration within the third portion of the common doping region.

For example, a relationship between an average doping concentration within the second portion 120 and an average doping concentration within the third portion may differ by less than 20% from a relationship between the average doping concentration within the second portion 120 and an average doping concentration within a part of the drift region having the same vertical extension within the semiconductor substrate as the third portion of the common doping region.

More details and aspects of the semiconductor device 300 are mentioned in connection with the proposed concept or one or more examples described above or below. The semiconductor device 300 may comprise one or more additional optional features corresponding to one or more aspects of the proposed concept or one or more examples described above (e.g. FIGS. 1-2) or below (e.g. FIG. 4).

FIG. 4 shows a flow chart of a method 400 for forming a semiconductor device. The method 400 comprises forming 410 a first portion of a common doping region located within a semiconductor substrate of the semiconductor device. A maximal doping concentration within the first portion 110 is higher than $1 \cdot 10^{15}$ cm$^{-3}$. The common doping region comprises a second portion 120. A minimal doping concentration within the second portion 120 is lower than 50% (or lower than 40%, lower than 30%, lower than 20%, lower than 10%, lower than 1%, lower than 0.1%) of the maximal doping concentration within the first portion of the common doping region. The common doping region comprises a third portion 130. A minimal doping concentration within the third portion 130 is more than 30% (or more than 50%, more than 100%) higher than the minimal doping concentration within the second portion 120. At least a part of the second portion 120 of the common doping region is located vertically between the first portion 110 of the common doping region and the third portion 130 of the common doping region. The method 400 further comprises forming 420 a doping region of an electrical element arrangement of the semiconductor device.

Forming the first portion of the common doping region having the above-mentioned distribution of doping concentrations may avoid or reduce a vertical and lateral expansion of a space charge region towards an edge of the semiconductor device (e.g. near the front-side surface of the semiconductor substrate), and may help avoid unstable behavior within an edge termination region of the semiconductor device.

For example, the forming 410 of the first portion 110 may comprise implantation of an n-blanket at the front-side surface of the semiconductor substrate, e.g. to increase the doping at the first portion 110. The forming 410 of the first portion 110 may comprise annealing after implantation of the n-blanket. The forming 410 of the first portion 110 may be based on implantation, for example. The forming 410 of the first portion 110 may be unstructured (e.g. blanket over at least a portion of the semiconductor substrate) or structured (e.g. using a shield based on photolithography). For example, an implantation dose for the forming 410 of the first portion 110 may be larger than $1 \cdot 10^{11}$ cm$^{-2}$ (or larger than $2 \cdot 10^{11}$ cm$^{-2}$, larger than $5 \cdot 10^{11}$ cm$^{-2}$) and/or smaller than $2 \cdot 10^{12}$ cm$^{-2}$ (or smaller than $1 \cdot 10^{12}$ cm$^{-2}$, smaller than $5 \cdot 10^{11}$ cm$^{-2}$). For example. Suitable donor atoms (for the forming 410 of the first portion) may e.g. be phosphorus (chemical symbol: P), arsenic (As) or antimony (Sb) or a combination of these atoms.

For example, the implantation dose for the forming 410 of the first portion 110 may be less than 10% (or less than 5%, less than 2%, less than 1%) of an implantation dose used for forming of a body region of an transistor arrangement of the semiconductor device. For example, the implantation dose used for the forming of the body region may be more than 50 times higher (or more than 75 times higher, more than 100 times higher, more than 150 times higher) than the implantation dose used for the forming 410 of the first portion 110.

The method may further comprise forming a base-doping profile for the semiconductor substrate by proton implantation from the front-side surface of the semiconductor substrate or by epitaxy. For example, the forming of the base-doping profile may be based on hydrogen-related donors. For example, the forming of the base-doping profile may form the second and third portions of the common doping region, and may form a part of a doping concentration of the first portion 110.

The forming 420 of the electrical element arrangement may form a source region or a body region of a transistor arrangement of the semiconductor device, for example.

For example, the method may further comprise forming of the second portion of the common doping region. For example, the method may further comprise forming of the third portion of the common doping region.

More details and aspects of the method 400 are mentioned in connection with the proposed concept or one or more examples described above or below. The method 400 may comprise one or more additional optional features corresponding to one or more aspects of the proposed concept or one or more examples described above (e.g. FIGS. 1-3) or below.

At least some embodiments may provide edge-termination structure stabilization for non-constant base doping. At least some embodiments may refer to the area of power semiconductors, especially IGBTs (Insulated-Gate Bipolar Transistors). For IGBTs where the base doping is vertically not constant, i.e. increasing from the front side of the chip to the backside of the chip, the edge-termination structure may be impacted. For such kind of profiles, a space charge region may expand significantly to the chip edges and may thus lead to an unstable behavior of the edge-termination properties.

In other devices, the base doping profiles may be vertically constant. Especially the width of the edge-termination may be designed according to the base doping.

At least some embodiments may be based on using an additional n-implantation (n-blanket, e.g. first portion of a common doping region) with a subsequent annealing step. The introduction of n-blanket improves the stability of the edge-termination structure. This additional implementation of donor atoms close to the interface/surface, where the significantly reduced drift zone doping occurs, may prevent (or reduce) an undesired vertical and lateral extension of the space charge region. In particular, the influence of surface and interface charges, which may be present close to the interface/surface, may be reduced. Preferentially, a penetration depth of this n-blanket region may be in the range between 500 nm and 3 microns.

In a preferred implementation, a base-doping profile may be created by proton implantation from the front-side or epitaxy plus an additional n-blanket implantation to increase the doping at the front-side of the chip.

The functionality of some embodiments may be shown in an experiment. Measurements may show a dependence of the breakdown voltage on the dose of the n-blanket implantation for proton induced base-doping profiles of an IGBT. In particular for the case of proton doping, there may be a (significant) decrease of the drift zone doping close to the surface. Experiments may show a reduction of the breakdown voltage by the n-blanket implantation for proton-induced profiles. By a proper choice of the n-blanket dose, the breakdown voltage may be adjusted to the value of the unshaped profile.

The implantation (of the first portion) may be unshielded (blanket) or structured. Both variants have been (experimentally) tested. For low doses, an unshielded implantation may be the better choice. Since the threshold voltage might not be impacted, it may be the cheapest solution as compared to a lithography process. The n-blanket dose might not be too high, i.e. below the dose of the p-body implantation, otherwise an impact on the threshold voltage may be found (in experiments). For reasonable doses, i.e. between about 2e11 to about 1e12 per $cm^2$, the threshold voltage might not be affected, but a significant impact on the breakdown voltage and an improvement of the leakage characteristics may be shown.

An edge termination structure of a semiconductor device may serve a number of different purposes, e.g. to avoid an impairment of a breakdown voltage of the semiconductor device. If a base doping of the semiconductor device is vertically not constant, e.g. increasing from the front side of the chip to the backside of the chip, the edge-termination structure may be impacted. For such profiles, the space charge region may expand significantly to the chip edges and may thus lead to an unstable behavior of the edge-termination properties.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
   a common doping region located within a semiconductor substrate of the semiconductor device, the common doping region comprising a first portion, a second portion and a third portion,
   wherein a maximal doping concentration within the first portion is higher than $1 \cdot 10^{15}$ cm$^{-3}$,
   wherein a minimal doping concentration within the second portion is lower than 50% of the maximal doping concentration within the first portion of the common doping region,
   wherein a minimal doping concentration within the third portion is more than 30% higher than the minimal doping concentration within the second portion,
   wherein at least a part of the second portion of the common doping region is located vertically between the first portion of the common doping region and the third portion of the common doping region,
   wherein a doping concentration within the second portion increases vertically towards a back side of the semiconductor substrate,
   wherein donors causing the vertical increase of the doping concentration within the second portion are hydrogen-related donors.

2. The semiconductor device of claim 1, wherein the first portion of the common doping region is located at a front side surface of the semiconductor substrate.

3. The semiconductor device of claim 1, wherein the first portion of the common doping region has a thickness of more than 400 nm.

4. The semiconductor device of claim 1, wherein the first portion of the common doping region has a thickness of less than 5 µm.

5. The semiconductor device of claim 1, wherein the first portion vertically extends from a front-side surface of the semiconductor substrate to a local minimum doping concentration within the common doping region, wherein the second portion vertically extends from the local minimum doping concentration to the third portion, wherein a doping concentration at the border between the second portion and the third portion is 30% higher than the local minimum doping concentration, and wherein the third portion vertically extends from the border between the second portion and the third portion towards a back-side surface of the semiconductor substrate.

6. The semiconductor device of claim 1, wherein the first portion of the common doping region has a lateral width of at least 5 µm.

7. The semiconductor device of claim 1, wherein the first portion of the common doping region is at least partially located in an edge termination region of the semiconductor device.

8. The semiconductor device of claim 1, wherein the first portion laterally extends over more than 50% of an edge termination region of the semiconductor device.

9. The semiconductor device of claim 1, wherein an edge termination region of the semiconductor device comprises a channel stopper region laterally located between the first portion of the common region and an edge of the semiconductor device.

10. The semiconductor device of claim 1, wherein the first portion laterally surrounds an active area of the semiconductor device.

11. The semiconductor device of claim 1, wherein the minimal doping concentration within the second portion is lower than $3 \cdot 10^{14}$ cm$^{-3}$.

12. The semiconductor device of claim 1, wherein a doping concentration within the third portion of the common doping region is larger than $4 \cdot 10^{12}$ cm$^{-3}$.

13. The semiconductor device of claim 1, wherein a doping concentration within the third portion of the common doping region is smaller than $1 \cdot 10^{15}$ cm$^{-3}$.

14. The semiconductor device of claim 1, wherein the common doping region comprises a drift region of an electrical element arrangement of the semiconductor device.

15. The semiconductor device of claim 14, wherein a vertical doping profile of the third portion differs from a vertical doping profile within a vertical part of the drift region located at the same depth range within a cell region of the semiconductor substrate as the third portion of the common doping region by less than 20% of a maximal doping concentration within the third portion of the common doping region.

16. The semiconductor device of claim 1, further comprising a transistor arrangement comprising a body region, wherein the body region extends at least 20% further into the semiconductor substrate than the first portion of the common doping region, and wherein a doping concentration within the body region is at least 20% higher than a doping concentration within the first portion.

17. The semiconductor device of claim 1, wherein an electrical element arrangement of the semiconductor device has a breakdown voltage of more than 10V.

18. A method for forming a semiconductor device, the method comprising:
   forming a first portion of a common doping region located within a semiconductor substrate of the semiconductor device, a maximal doping concentration within the first portion being higher than $1 \cdot 10^{15}$ cm$^{-3}$;
   forming a second portion of the common doping region, a minimal doping concentration within the second portion being lower than 50% of the maximal doping concentration within the first portion of the common doping region;
   forming a third portion of the common doping region, a minimal doping concentration within the third portion being more than 30% higher than the minimal doping concentration within the second portion, at least a part of the second portion of the common doping region being located vertically between the first portion of the common doping region and the third portion of the common doping region; and
   forming a doping region of an elegy element arrangement in the semiconductor substrate,
   wherein a doping concentration within the second portion increases vertically towards a back side of the semiconductor substrate, wherein donors causing the vertical increase of the doping concentration within the second portion are hydrogen-related donors.

* * * * *